US005740183A

United States Patent [19]
Lowe

[11] Patent Number: 5,740,183
[45] Date of Patent: Apr. 14, 1998

[54] METHOD AND APPARATUS FOR THE OPERATIONAL VERIFICATION OF A MICROPROCESSOR IN THE PRESENCE OF INTERRUPTS

[75] Inventor: William M. Lowe, Austin, Tex.

[73] Assignee: Advanced Micro Devices, Inc., Sunnyvale, Calif.

[21] Appl. No.: 761,005

[22] Filed: Dec. 5, 1996

[51] Int. Cl.$^6$ .................................................. G06F 11/00
[52] U.S. Cl. ..................................... 371/25.1; 395/183.01
[58] Field of Search ............................... 371/25.1, 26, 27, 371/22.6; 395/183.01, 183.04, 183.05, 183.07

[56] References Cited

U.S. PATENT DOCUMENTS

| | | | |
|---|---|---|---|
| 4,998,250 | 3/1991 | Kohlmeier et al. | 371/15.1 |
| 5,321,828 | 6/1994 | Phillips et al. | 315/500 |

*Primary Examiner*—Vincent P. Canney
*Attorney, Agent, or Firm*—Kevin L. Daffer; Conley, Rose & Tayon

[57] ABSTRACT

Presented are a method an apparatus for operational verification of a microprocessor subject to an interrupt during a "target" activity. A software model of the microprocessor allows determination of the start and end of the target activity via one or more signals generated during the target activity. A testing program causes the microprocessor model to produce a timing signal (i.e., a trigger event) a number of system clock cycles (i.e., a delay time) before the target activity begins. A software memory model coupled to the microprocessor model includes an interrupt signal generator. The interrupt signal generator receives the trigger event and generates an interrupt signal after the delay time expires following the trigger event. A simulation trace obtained during a first "characterization" procedure is used to determine the delay time. Following the characterization procedure, the microprocessor replaces the microprocessor model. Execution of the testing program by the microprocessor causes the interrupt to occur during the target activity, and causes the microprocessor to produce a test result. The test result is compared to an expected result to determine proper operation. The microprocessor model and the memory model are contained within a memory unit of a microprocessor testing system during testing. The microprocessor testing system includes a central processing unit (CPU), chip set logic, a system bus, and a memory bus in addition to the memory unit.

30 Claims, 6 Drawing Sheets

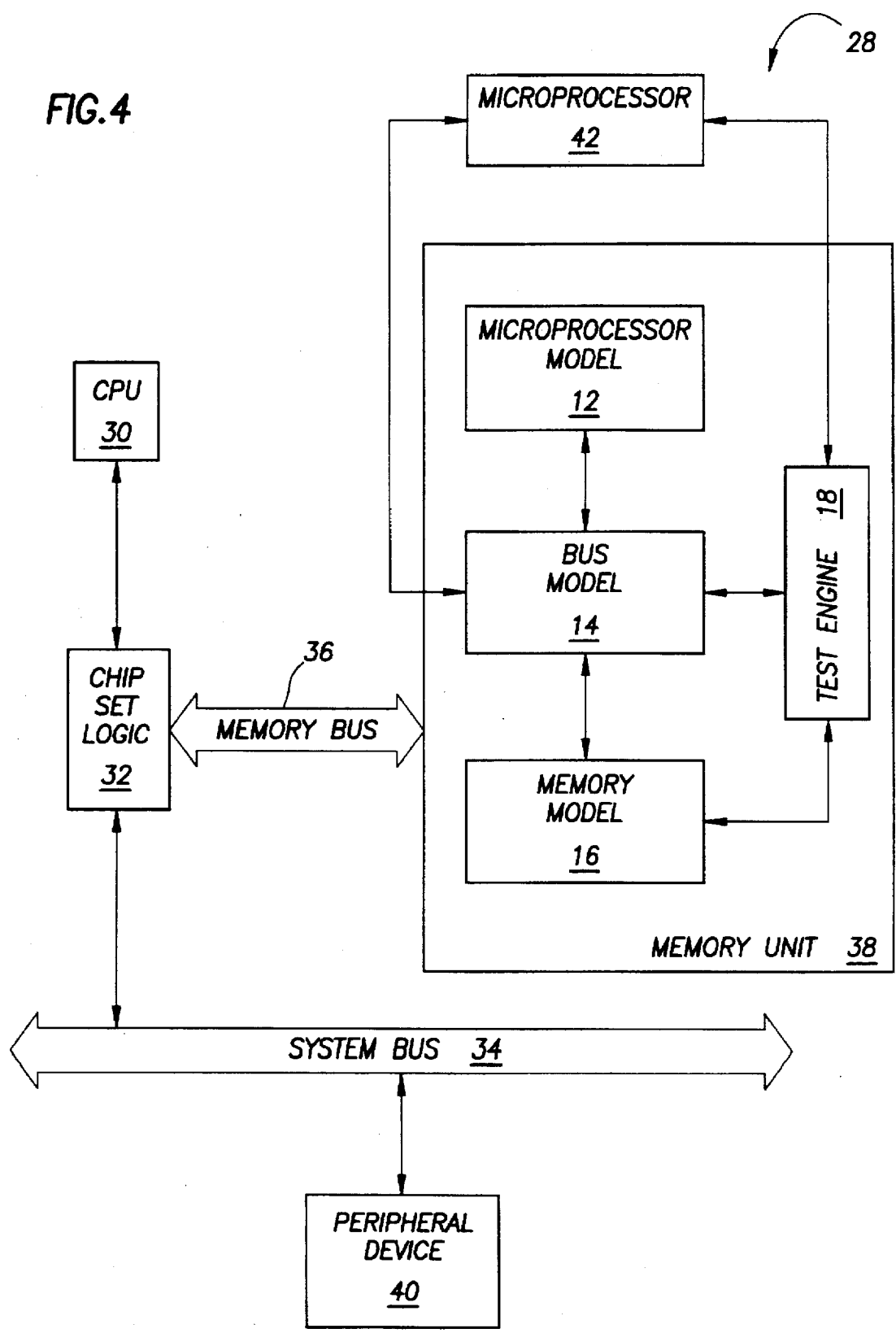

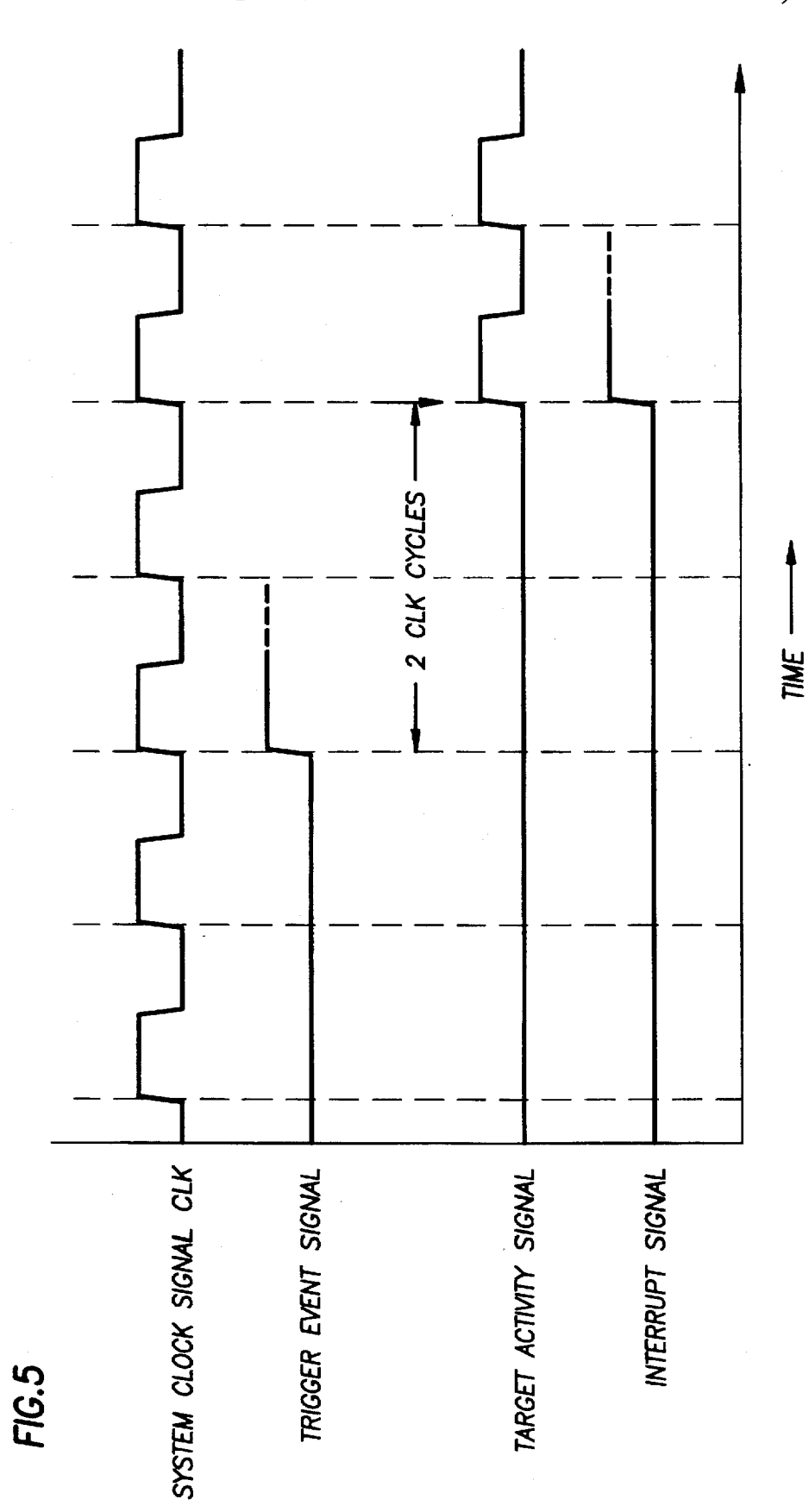

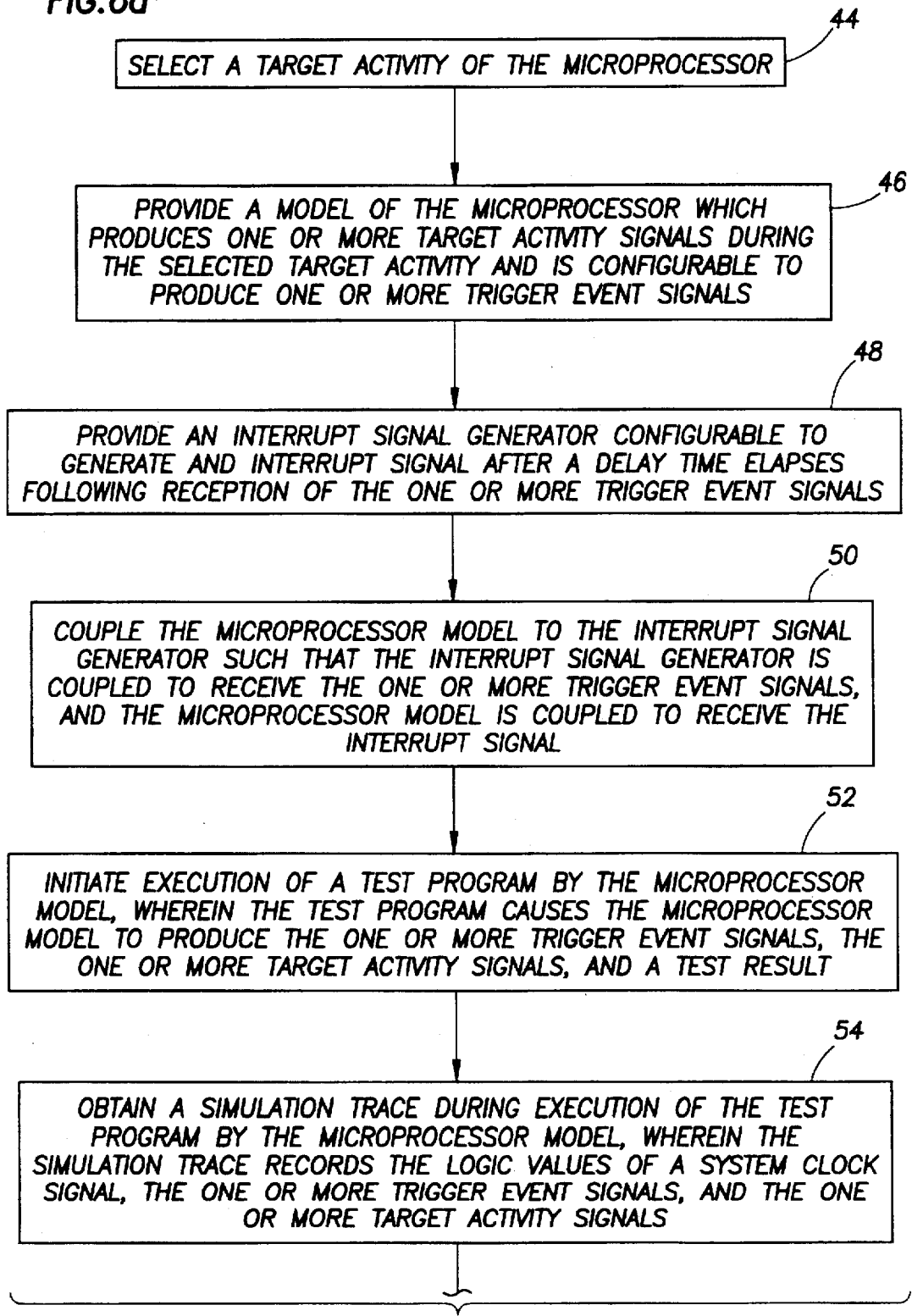

METHOD AND APPARATUS FOR THE OPERATIONAL VERIFICATION OF A MICROPROCESSOR IN THE PRESENCE OF INTERRUPTS

BACKGROUND OF THE INVENTION

1. Field of the Invention

This invention relates to the manufacture of integrated circuits and more specifically to operational verification of a microprocessor in the presence of interrupts.

2. Description of the Relevant Art

A microprocessor must be able to correctly execute instructions of a software application program while responding to one or more interrupts. As used herein, the term "interrupt" refers to an external event which signals a high-priority request for service from a device coupled to the microprocessor. For example, a peripheral device which is ready to transmit data to or receive data from the microprocessor may assert an interrupt signal. Originating from outside the microprocessor, an interrupt is ordinarily not synchronized with a clock signal which orchestrates the internal activities of the microprocessor.

A microprocessor is typically coupled to one or more external memory units which store sets of instructions and data (i.e., computer programs). An application program is a computer program which performs a specific function and is designed to operate within a controlled environment provided by an operating system. An operating system is a collection of computer programs which provide file management and input/output control functions. MS-DOS® and Windows NT™ (Microsoft Corp.) are common operating systems.

A section of the lowermost portion of the physical address space of a microprocessor is typically dedicated to operating system functions. During microprocessor initialization, an operating system generally loads an interrupt vector table into the lowermost 1,024 (1k) bytes of an external memory unit starting at memory location 00000h. The interrupt vector table contains the starting addresses of interrupt service routines. The interrupt service routines are themselves computer programs, and are typically stored in the lowermost portion of the external memory unit along with the interrupt vector table.

The two general categories of types of interrupts are "non-maskable" and "maskable". A single non-maskable interrupt (NMI) signal line of the microprocessor is typically reserved for informing the microprocessor that a catastrophic event has occurred or is about to occur. Examples of non-maskable interrupts include bus parity error, failure of a critical hardware component such as a timer, and imminent loss of electrical power. Maskable interrupts are lower-priority requests for service which will not result in catastrophic events if not honored immediately. Maskable interrupts may be ignored by the microprocessor under program control. A request for service from a peripheral device which is ready to transmit data to or receive data from the microprocessor is an example of a maskable interrupt. A programmable interrupt controller (PIC) typically receives maskable interrupt requests from devices coupled to the microprocessor, prioritizes the interrupt requests, and activates a single maskable interrupt (INTR) signal line of the microprocessor as required.

When a microprocessor receives an interrupt, application program execution stops, the contents of certain critical registers are saved (i.e., the internal state of the microprocessor is saved), and internal control is transferred to an interrupt service routine (i.e., an interrupt handler) which corresponds to the type of interrupt received. When the interrupt service routine is completed, the saved contents of the critical registers are restored (i.e., the state of the microprocessor is restored), and the microprocessor resumes application program execution at the point where execution was interrupted. Other than the time required to accomplish the interrupt service routine, the handling of the interrupt should not affect application program execution.

It is possible, however, for an error in the hardware associated with a microprocessor state save and restoration mechanism, or in the coding of an interrupt service routine, to cause the microprocessor to produce an incorrect result when interrupted during a given activity. A complete verification of the operation of a microprocessor must thus involve ensuring the microprocessor produces correct results during all possible activities, and also when interrupts occur during all such activities. Candidate microprocessor activities include arithmetic calculations, program control transfers resulting from jump, call, or return instructions, page table accesses, and instruction fetches from an external memory unit.

The occurrence of a given microprocessor activity is typically witnessed by assertions of signals produced by the activity. Access to such activity signals is required to determine when the activity is occurring. Following manufacture, a microprocessor is typically sealed within a protective semiconductor device package. Access to signals produced by the microprocessor is typically confined to several terminals (i.e., pins) on one or more external surfaces of the device package. Very few of the signals produced within the microprocessor are brought out to the pins of the microprocessor device package. As a result, there is often no direct way to ascertain when a given microprocessor activity occurs. Without knowing when the activity occurs, there is no way to ensure an interrupt signal is generated during the microprocessor activity. Thus proper operation of the microprocessor subject to an interrupt during the activity cannot be verified, and a complete operational verification of the microprocessor is not possible.

It would thus be desirable to have a functional testing method and apparatus which allows a desired microprocessor activity to be singled out for testing, and provides the ability to generate an interrupt during the selected microprocessor activity. Such a method and apparatus would facilitate verification of the proper operation of the microprocessor subject to an interrupt during all microprocessor activities (i.e., a complete operational verification of the microprocessor).

SUMMARY OF THE INVENTION

The problems outlined above are in large part solved by a method and apparatus for operational verification of a microprocessor in the presence of interrupts. As manufactured, the microprocessor is sealed within a protective semiconductor device package, and access to signals produced within the microprocessor is limited to the signals brought out to corresponding pins of the device package. As described above, a complete operational verification of the microprocessor requires the ability to confirm proper microprocessor operation subject to an interrupt during all microprocessor activities. In order to allow a determination of when a selected internal activity (i.e., a "target" activity) occurs, the present method employs an operational model of the microprocessor. Such a determination may not be possible using the microprocessor itself as the signals produced during the target activity may not be reflected at the pins of the microprocessor package.

The microprocessor model is a software model of the microprocessor, including a set of instructions from a defined programming language (e.g., C or C++) or a hardware design language (e.g., Verilog or VHDL). The microprocessor model produces one or more signals during the target activity (i.e., target activity signals). The one or more target activity signals may be recorded during execution of a testing program, allowing a determination of when the target activity starts and ends.

The testing program includes instructions from an instruction set of the microprocessor along with associated data. Execution of the testing program by the microprocessor model causes the microprocessor model to produce a timing signal (i.e., a trigger event) a certain number of system clock cycles before the target activity begins. The system clock signal coordinates the activities of the microprocessor and devices coupled to the microprocessor. A trigger event occurs when the microprocessor model simultaneously produces a predetermined combination of one or more signals (i.e., trigger event signals) which would be coupled to the pins of the microprocessor device package. The one or more trigger event signals are received by an interrupt signal generator coupled to the microprocessor. The interrupt signal generator is configurable to generate an interrupt signal a certain number of cycles of a system clock signal (i.e., a delay time) after the trigger event is received.

In order to properly configure the interrupt signal generator to generate the interrupt signal during the target activity, a "characterization" procedure is first performed. During the characterization procedure, the required delay time between the trigger event and the target activity is determined, and the interrupt signal generator is configured to generate the interrupt signal after the delay time expires following reception of the trigger event. The microprocessor model is employed during the characterization procedure as target activity signals produced by the microprocessor model may be recorded. Execution of the testing program during the characterization procedure causes the microprocessor model to produce the trigger event, to perform the target activity, and to produce a test result. The system clock signal, the one or more trigger event signals, and the one or more target activity signals occurring during testing program execution are recorded in a simulation log or "trace". The simulation trace is then used to determine the number of system clock cycles occurring between the one or more trigger event signals and the one or more target activity signals. The interrupt signal generator is then configured to generate the interrupt signal the determined number of system clock cycles after the one or more trigger event signals are received.

Following the characterization procedure, proper operation of the microprocessor model during the target activity and subject to interrupts may be verified during a subsequent execution of the testing program. The testing program causes the microprocessor model to produce the trigger event signal, perform the target activity, and to produce a test result. During execution of the testing program, the interrupt signal generator generates the interrupt signal after the delay time expires following reception of the trigger event (i.e., during the target activity). Testing program execution is thus interrupted during the target activity, and the microprocessor model performs an interrupt service routine. The ability of the microprocessor model to produce a result which matches an expected result demonstrates proper operation of the microprocessor model during the target activity and subject to interrupts.

By replacing the microprocessor model with the microprocessor under test, proper operation of the microprocessor under test during the target activity and subject to interrupts may be verified by causing the microprocessor under test to execute the testing program. As with the microprocessor model, the testing program causes the microprocessor to produce the trigger event signal, perform the target activity, and to produce a test result. By virtue of proper configuration of the interrupt signal generator during the characterization procedure and identical timing relationships between the microprocessor model and the microprocessor under test, the interrupt signal generator generates the interrupt signal during the target activity. Testing program execution is thus interrupted during the target activity, and the microprocessor under test performs an interrupt service routine. The ability of the microprocessor under test to produce a result which matches an expected result demonstrates proper operation of the microprocessor under test during the target activity and subject to interrupts.

Execution of the testing program causes the microprocessor to produce a test result. The test result is compared to an expected result derived from a functional specification of the microprocessor. Any difference between the test result produced by the microprocessor and the expected result represents a failure of the functional test. Such a functional test failure may indicate improper microprocessor operation when subjected to the interrupt during the target activity. An error in the hardware associated with a microprocessor state save and restoration function, or a software error in the interrupt service routine, may cause such a failure.

The microprocessor model functions as a part of a microprocessor test group. The microprocessor test group includes the microprocessor model, a memory model, a bus model, and a test engine. Like the microprocessor model, the bus model, the memory model, and the test engine are implemented in software. The software memory model, bus model, and test engine may include sets of instructions from a defined programming language (e.g., C or C++) or a hardware design language (e.g., Verilog or VHDL). The memory model is configured to store data, and also includes the interrupt signal generator and one or more control registers used to store the delay time between the trigger event and generation of the interrupt signal. The bus model includes representations of address signal lines, data signal lines, and control signal lines.

During the characterization procedure, the bus model is coupled between the microprocessor model and the memory model, and facilitates the transfer of data between the microprocessor model and the memory model. Following the characterization procedure, the microprocessor under test replaces the microprocessor model. The bus model is coupled between the microprocessor (i.e., the pins of the microprocessor package) and the memory model, and facilitates the transfer of data between the microprocessor and the memory model. The test engine is coupled to the microprocessor model, the bus model, and the memory model during the characterization procedure and is configured to initiate execution of the testing program by the microprocessor model, to check for proper operation of the other elements of the microprocessor test group during execution of the testing program, and to record the states of predetermined signals during execution of the testing program in order to form the simulation trace. Following the characterization procedure, the test engine is coupled to the microprocessor, the bus model, and the memory model, and is configured to initiate execution of the testing program by microprocessor 42 and to check for proper operation of microprocessor 42, bus model 14, and memory model 16 during testing program execution.

Elements of the microprocessor test group, embodied as software and including sets of instructions and data, are contained within a memory unit of a microprocessor testing system during testing. The microprocessor testing system includes a central processing unit (CPU), chip set logic, a system bus, a memory bus, and a memory unit. The CPU is configured to execute instructions. The system bus is adapted for coupling to one or more peripheral devices. The chip set logic forms an interface between the CPU and the system bus, and between the CPU and the memory bus. The memory bus is used to transfer data between the CPU and the memory unit via the chip set logic. The memory unit is coupled to the memory bus and is configured to store data. Following the characterization procedure, the microprocessor under test is coupled to the bus model and the test engine in place of the microprocessor model.

BRIEF DESCRIPTION OF THE DRAWINGS

Other objects and advantages of the invention will become apparent upon reading the following detailed description and upon reference to the accompanying drawings in which:

FIG. 4 is a block diagram of the microprocessor testing system of FIG. 3 configured to perform functional testing upon a manufactured microprocessor, wherein the manufactured microprocessor is substituted for the microprocessor model shown in FIG. 3;

FIG. 5 is a timing diagram illustrating the generation of an interrupt signal during a target activity in accordance with the present method; and FIGS. 6a–b make up a flow diagram of the present method of performing functional testing upon the microprocessor under test in order to verify proper operation of the microprocessor during a selected target activity and subject to an interrupt signal.

Figure 1:
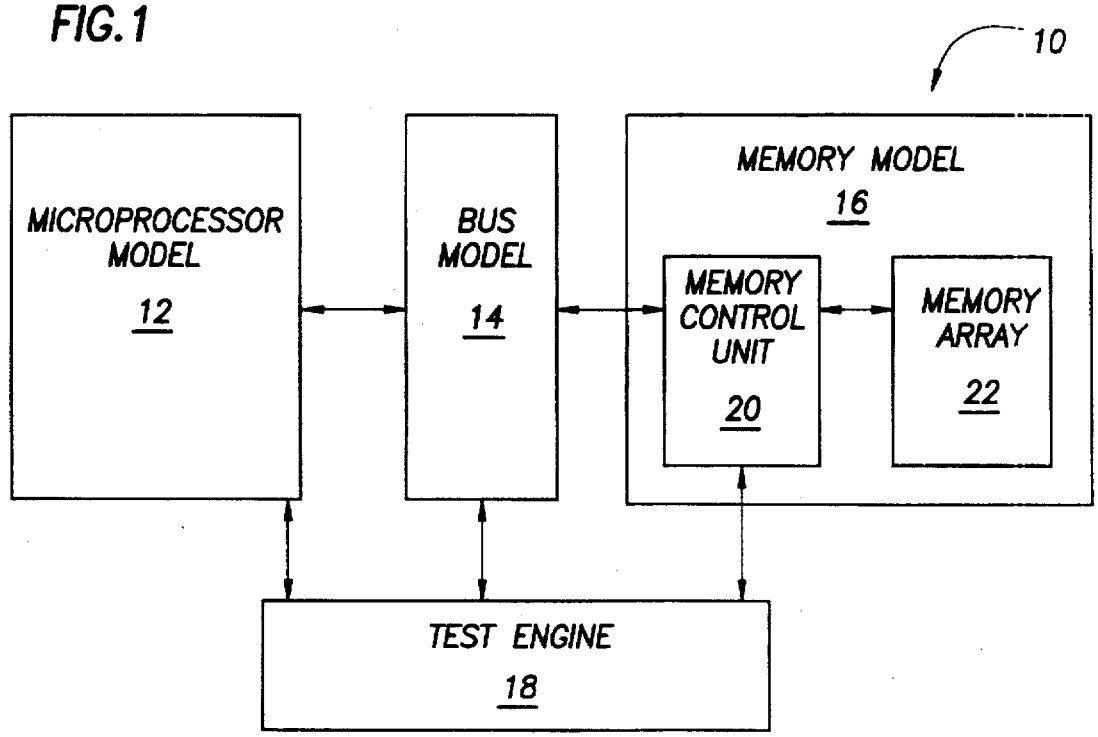
FIG. 1 is a block diagram of a microprocessor test group including a software model of a microprocessor under test, a bus model, a memory model, and a test engine.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

In order to test the ability of a manufactured microprocessor to properly respond to an interrupt (i.e., to respond to an interrupt without otherwise affecting application program execution), it is necessary to cause an interrupt to occur during any microprocessor activity. This involves being able to determine when a selected "target" activity starts and ends, as well as the ability to control the occurrence of the interrupt such that the interrupt occurs during the target activity. The present method employs an operational model of the microprocessor to allow one or more target activity signals produced during the target activity to be recorded. A simulation trace obtained during execution of a testing program is used to determine when an otherwise undetectable target activity starts and ends.

A second requirement of a method to test proper interrupt response is the ability to cause an interrupt to occur during the target activity. In the present method, the microprocessor model produces a timing signal (i.e., a trigger event) a certain number of system clock cycles (i.e., a delay time) before the target activity begins. A trigger event occurs when the microprocessor model simultaneously produces a predetermined combination of one or more signals (i.e., trigger event signals) coupled to the pins of the microprocessor device package. The one or more trigger event signals are received by an interrupt signal generator coupled to the microprocessor. The interrupt signal generator is configurable to generate an interrupt signal after the delay time expires following the trigger event. The interrupt signal generator may thus be configured to cause an interrupt to occur during the target activity.

FIG. 1 is a block diagram of a microprocessor test group 10. Microprocessor test group 10 includes a microprocessor model 12, a bus model 14, a memory model 16, and a test engine 18. Microprocessor model 12 is an operational model of the microprocessor under test. Microprocessor model 12 is configured to execute instructions, preferably x86 instructions. Memory model 16 is a model of a memory system, and is configured to store data. Memory model 16 also includes a special functional unit described below which generates control signals. The special functional unit also generates a system clock signal CLK which coordinates the activities of microprocessor model 12, bus model 14, and memory model 16. Bus model 14 models the address, data, and control signal lines of a typical microprocessor bus structure.

During the characterization procedure, bus model 14 is coupled between microprocessor model 12 and memory model 16. Microprocessor model 12 fetches data (i.e., reads) from memory model 16 via bus model 14, and stores data (i.e., writes) to memory model 16 via bus model 14. Test engine 18 is coupled to microprocessor model 12, bus model 14, and memory model 16. Test engine 18 is configured to initiate execution of the testing program by microprocessor model 12, to check for proper operation of the other elements of the microprocessor test group during execution of the testing program, and to record the states of predetermined signals during testing program execution in order to form the simulation trace.

Microprocessor model 12 is implemented in software. A software implementation of microprocessor model 12 includes a set of instructions from a defined programming language or a hardware design language. Suitable programming languages include C and C++. C and C++ are classified as high-level computer programming languages along with FORTRAN, COBOL, BASIC, Pascal, and Ada. C and C++ statements (i.e., instructions) and associated data may be grouped together into functions which represent the operations performed by functional units and subsystems of a microprocessor. A computer program called a compiler is typically used to translate C and C++ programs into machine language instructions of the processor of the computer system upon which the compiled program will be executed.

In a similar manner, the C or C++ instructions included in a model of a microprocessor are compiled into machine language instructions of the processor of the computer system upon which they will be simulated. Simulation of a software implementation of a microprocessor model involves loading the compiled instructions and associated data of the microprocessor model into the main memory unit of a computer system, providing a set of instructions and data (i.e., a testing program) which the microprocessor model may access, and initiating execution of the testing program by the microprocessor model.

In a programming language such as C and C++, a signal may be represented as a value stored in one or more bit positions of a multiple-bit storage location within a memory unit. For example, a 16-bit storage location may be used to store as many as 16 single-bit signal values, each of which may be in one of two logic states (e.g., either a logic '0' state or a logic '1' state). Furthermore, the storage location as a whole may represent a bus structure with 16 separate signal lines, each of which may be in either a logic '0' state or a logic '1' state. Alternately, the storage location may be used to represent one 16-bit register, two 8-bit registers, etc. Storage locations of a memory unit may be modeled as a declared array.

Functional units and subsystems may be modeled behaviorally, algorithmically, or structurally. A behavioral model of a functional unit or subsystem includes a set of equations which generate output signals from the values of input signals. An algorithmic model of a functional unit or subsystem generates the values of output signals from the values of input signals according to a predefined sequence of steps. A structural model of a functional unit or subsystem includes a group of interconnected logic gate models which generate output signals from the values of input signals. The logic gates themselves may be represented structurally, behaviorally, or algorithmically. For example, a subsystem which generates an output signal 'c' from input signals 'a' and 'b' according to the exclusive OR function may be modeled behaviorally using:

$$c = a \oplus b$$

where '$\oplus$' is the exclusive OR operator. The same subsystem may be modeled algorithmically by initializing the logic value of 'c' to '0', summing the logic values of 'a' and 'b', and setting the value of 'c' to '1' only if the sum is equal to '1'. A structural model of the subsystem may be formed using models of a two-input OR gate, a two-input NAND gate, and a two-input AND gate. The inputs to the OR gate and the NAND gate models are signals 'a' and 'b', the output of the NOR gate model is one input to the AND gate model, and the output of the NAND gate model is the other input to the AND gate model. The output of the AND gate model is 'c', where the value 'c' is determined by the interconnected logic gate models and is equal to 'a$\oplus$b'.

A hardware design language may also be used to implement a software implementation of microprocessor model 12. Suitable hardware design languages include Verilog and the VHSIC hardware description language (VHDL). Hardware description languages are high-level languages specifically adapted to model electronic circuits and systems. Verilog is patterned after the C programming language, and VHDL is patterned after the Ada programming language. Verilog and VHDL include built-in hardware constructs such as signals ('events' in Verilog), standard logic gates, registers, and buses. Built-in functions model standard logic gates in VHDL and Verilog. During simulation, the output signals produced by modeled logic gates are determined from the values of the input signals. Signals in VHDL and events in Verilog are defined and manipulated just as variables are defined and manipulated in a high-level programming language. A bus is normally represented as a declared linear array (i.e., a vector) of storage locations within a memory unit. The storage locations store the logic states of the signal lines of the bus (e.g., '0', '1', and 'Z', where 'Z' is a high-impedance state). Storage locations of memory units may be modeled as declared arrays. Functional units and subsystems may be modeled behaviorally, algorithmically, or structurally as described above. Software models written in Verilog or VHDL are typically simulated as described above. The software model may also be "translated" into geometric data which completely describes the layout of an integrated circuit which performs the functions of the model (i.e., a hardware implementation of the model) by a computer program referred to as a silicon compiler or synthesizer.

Bus model 14, memory model 16, and test engine 18 are also implemented in software. Software implementations include a set of instructions from a defined programming language or a hardware design language as described above. Software instructions and data arising from these components are configured within a memory unit during use. The memory unit is accessible by a microprocessor testing system. Bus model 14, memory model 16, and test engine 18 are preferably implemented in a suitable hardware design languages such as Verilog or VHDL. Memory model 16 includes a memory control unit 20 and a memory array 22. Memory array 22 is configured to store data and includes storage locations of the memory unit. Memory control unit 20 includes software instructions which save data to, and retrieve data from, storage locations within memory array 22. Memory control unit 20 also includes a special functional unit described below which generates control signals and the system clock signal CLK.

Figure 2:
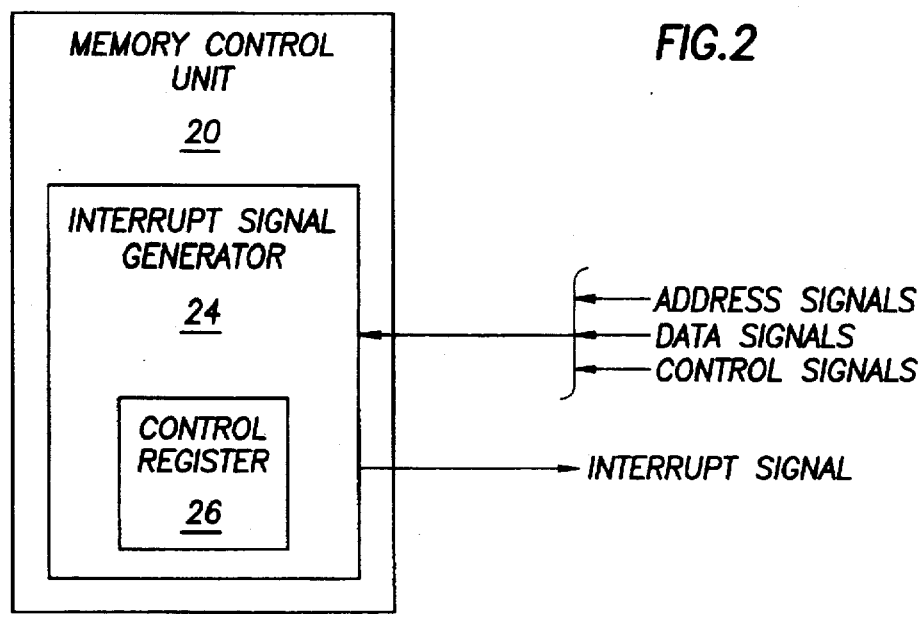
FIG. 2 is a block diagram of a preferred embodiment of a memory control unit of the memory model of FIG. 1, wherein the memory control unit includes an interrupt signal generator, and wherein the interrupt signal generator includes a control register.

FIG. 2 is a block diagram of a preferred embodiment of memory control unit 20 including an interrupt signal generator 24. Interrupt signal generator 24 generates one or more interrupt signals. Examples of common x86 microprocessor interrupt signals include non-maskable interrupt (NMI), maskable interrupt (INTR), reset (RESET), and stop clock (STPCLK#). Interrupt signal generator 24 includes a control register 26. Control register 26 is used to store the number of system clock cycles to delay generation of a corresponding interrupt signal following the trigger event. Control register 26 is configured to store data, and may be accessed using address and control signals just like a storage location within memory array 22. In other words, data may be stored in control register 26 by a write operation to the address assigned to control register 26, and data stored within control register 26 may be retrieved by a read operation to the address assigned to control register 26.

Memory control unit 20 also preferably includes several other such "addressable" registers which may be accessed like memory locations and are configured to store key operating parameters and status information. Such operating parameters and status information may be used to generate other control signals such as cache control signals and bus arbitration signals. Examples of x86 cache control signals include cache enable (KEN#) and cache flush (FLUSH#). Examples of common x86 bus arbitration signals include bus hold request (HOLD) and backoff (BOFF#). Generated interrupt and other control signals are stored in corresponding storage locations of bus model 14 which represent control signal lines.

A trigger event occurs when microprocessor model 12 simultaneously produces signals upon one or more address, data, and control signal lines of bus model 14 which match predetermined trigger event signals. The one or more trigger event signals are simultaneously generated by microprocessor model 12 during testing program execution. Interrupt signal generator 24 is coupled to receive the one or more address, data, and control signals of bus model 14, and to detect the occurrence of a trigger event. When interrupt signal generator 24 detects a trigger event, interrupt signal generator 24 generates an interrupt signal after a delay time has elapsed following detection of the trigger event (i.e., reception of the trigger event signals). The delay time is determined by the value stored in control register 26. The value stored in control register 26 is the number of system clock cycles to delay the generation of the interrupt signal after detecting the trigger event.

Some microprocessors save data to be written to the main memory unit in a collection of temporary storage locations (i.e., a write buffer) and proceed with instruction executions. Such "buffered writes" are saved to the main memory unit when the bus is not being used to fetch required instructions or data. In this case, the exact time that the one or more trigger event signals are generated may differ each time the testing program is executed. It is therefore desirable that an instruction which generates the predetermined bus cycle be an instruction which is completed before the microprocessor executes the next instruction in the testing program. For example, several microprocessors carry out I/O write instructions before executing subsequent instructions. The x86 'out' instruction is such an instruction, and may be advantageously employed to generate the one or more trigger event signals.

Microprocessor execution of the machine code version of an x86 'out' such as 'out 20h, eax' thus adds necessary predictability to the production of a trigger signal. Execution of the 'out 20h, eax' instruction causes the microprocessor to write the value within the 'eax' register to an input/output (I/O) device associated with address '20h' during an I/O bus cycle. In the process, the one or more trigger event signals are stored within the storage locations of bus model 14 representing address, data, and control signal lines. Interrupt signal generator 24 receives the values of the address, data, and control signals stored in bus model 14, compares them to the predetermined trigger event signals, and determines that the received signals match the predetermined trigger event signals. As a result, interrupt signal generator 24 detects a trigger event, and generates an interrupt signal following a delay time determined by the value stored in control register 26.

Figure 3:
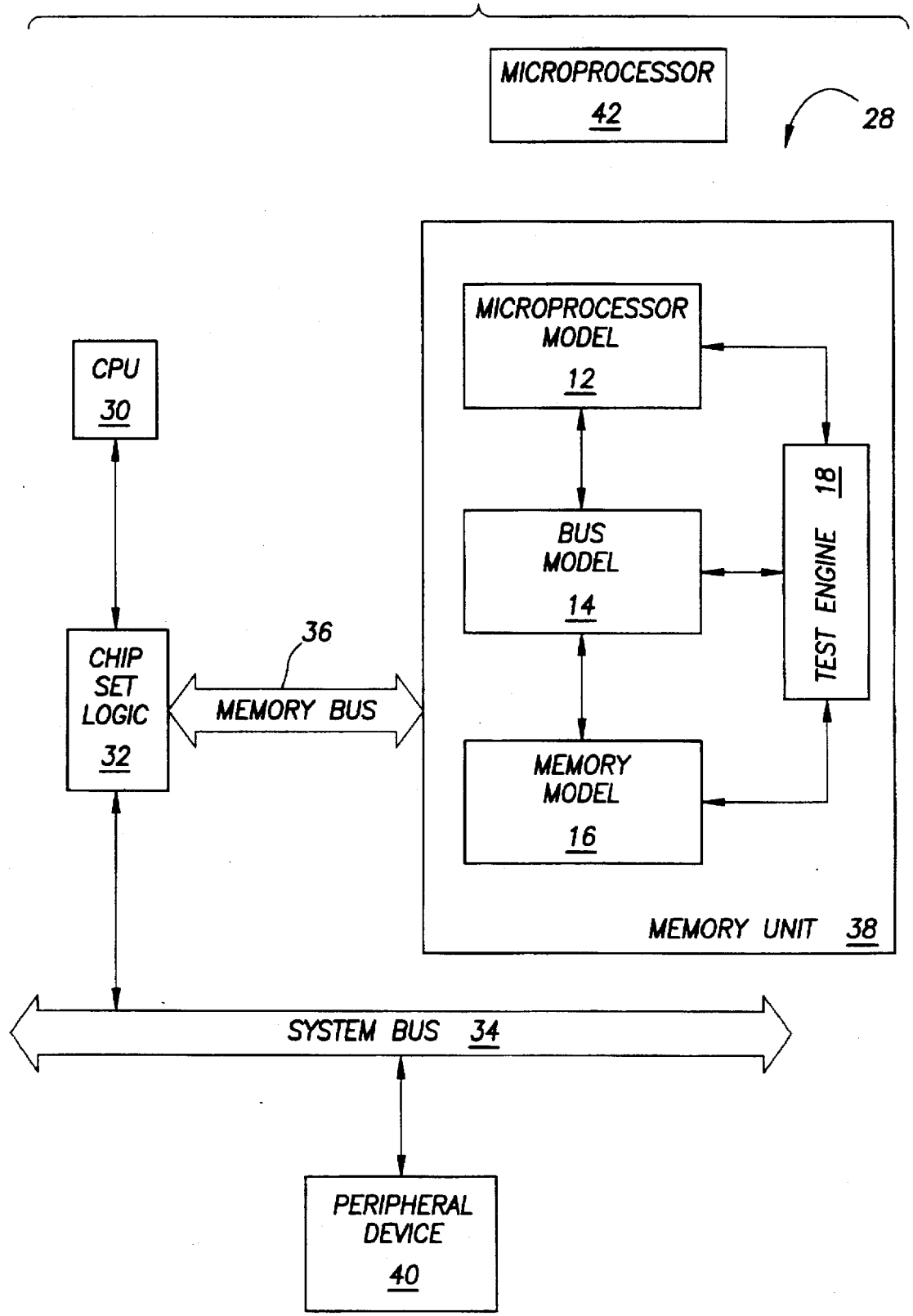
FIG. 3 is a block diagram of a microprocessor testing system configured to perform a characterization procedure in order to determine the number of system clock cycles between a trigger event and a target activity.

FIG. 3 is a block diagram of a microprocessor testing system 28 configured to perform a first "characterization" procedure in order to determine the number of system clock cycles between the occurrence of the one or more trigger event signals and the target activity. Microprocessor 42 is the microprocessor under test, and is not coupled to any element of microprocessor testing system 28 during the characterization procedure. Microprocessor testing system 28 includes a central processing unit (CPU) 30 coupled to chip set logic 32. Chip set logic 32 is coupled to a system bus 34 and a memory bus 36. A memory unit 38 is coupled to memory bus 36. A peripheral device 40 is coupled to system bus 34. Peripheral device 40 may be, for example, a disk drive unit, a video display unit, or a printer. CPU 30 obtains data (i.e., reads) from memory unit 38 via chip set logic 32, and stores data (i.e., writes) to memory unit 38 via chip set logic 32. Chip set logic 32 functions as interface between CPU 30 and system bus 34, and between CPU 30 and memory unit 38. Chip set logic 32 preferably includes a memory controller. Memory unit 38 is configured to store data, and preferably includes semiconductor memory devices. During use of microprocessor testing system 28, memory unit 38 includes all elements of microprocessor test group 10 as shown.

During the characterization procedure, microprocessor model 12 is caused to execute the testing program in order to determine the number of system clock cycles between the occurrence of the one or more trigger event signals and the target activity. As shown in FIG. 4, bus model 14 and test engine 18 are coupled to microprocessor model 12 during the characterization procedure. The status of the system clock signal, the one or more trigger event signals, and the target activity signals are recorded during testing program execution. Such recording preferably results in a simulation trace consisting of either a graph of the logic levels of the selected signals versus time, or a series of symbols representing the logic levels of the selected signals versus time.

Following testing program execution, the simulation trace is used to determine the number of system clock cycles between the occurrence of the one or more trigger event signals and the target activity signals. The starting and ending times of the target activity are determined based upon changes in logic levels of one or more of the target activity signals. A desired interrupt signal generation time is selected which falls between the starting and ending times of the target activity. The number of system clock cycles occurring between the one or more trigger event signals and the desired interrupt signal generation time are counted. The testing program is modified to cause the number of system clock cycles occurring between the one or more trigger event signals and the desired interrupt signal generation time to be written to control register 26 prior to generation of the one or more trigger event signals. This modification may be made by adding an instruction which writes the appropriate value to the address of control register 26 prior to generation of the one or more trigger event signals. Subsequent executions of the testing program will thus cause interrupt signal generator 24 to generate the desired interrupt signal during the target activity. The test result produced by microprocessor model 12 during the characterization procedure is ignored.

FIG. 4 is a block diagram of microprocessor testing system 28 configured to perform functional testing upon microprocessor 42. Microprocessor model 12 has been decoupled from bus model 14 and test engine 18, and microprocessor 42 has been coupled to bus model 14 and test engine 18 in place of microprocessor model 12. Thus bus model 14 is selectively coupled between microprocessor 42 and memory model 16. Microprocessor 42 fetches data (i.e., reads) from memory model 16 via bus model 14, and stores data (i.e., writes) to memory model 16 via bus model 14. Test engine 18 is coupled to microprocessor 42, bus model 14, and memory model 16. Test engine 18 is configured to initiate execution of the testing program by microprocessor 42 and to check for proper operation of microprocessor 42, bus model 14, and memory model 16 during execution of the testing program.

During testing, microprocessor 42 is caused to execute the testing program. As described above, the testing program causes microprocessor 42 to produce the one or more trigger event signals, perform the target activity, and to produce a test result. During testing program execution, microprocessor 42 produces the one or more trigger event signals which are detected by interrupt signal generator 24. Following detection of the one or more trigger event signals, interrupt signal generator 24 generates an interrupt signal after the number of system clock cycles stored in control register 26 elapse. As a result, interrupt signal generator 24 generates an interrupt signal during the target activity. The interrupt signal forces microprocessor 42 to suspend testing program execution during the target activity, handle the interrupt, then resume testing program execution as described above. The result produced by microprocessor 42 during testing program execution is then compared to an expected result. Any difference between the result produced by microprocessor 42 and the expected result may indicate an error in the hardware associated with a microprocessor state save and restoration function, or a software error in the interrupt service routine.

FIG. 5 is a timing diagram illustrating the generation of an interrupt signal during a target activity in accordance with the present method. The timing diagram shows the logic values of the system clock signal CLK, a trigger event signal, a target activity signal, and an interrupt signal. The upper portion of FIG. 3, including system clock signal CLK, the trigger event signal, and the target activity signal, may be produced as a simulation log during the characterization procedure. The rising edge of the trigger event signal represents occurrence of the trigger event signal. The first rising edge of the target activity signal represents the start of the target activity. Thus the trigger event occurs 2 cycles of system clock signal CLK before the target activity begins. Following execution of the testing program by the microprocessor model, the testing program is modified as described above to cause the number '2' to be written to control register 26 prior to generation of the trigger event signal.

It is noted that the interrupt signal may also be caused to occur just before or just after the target activity. The ability to generate the interrupt signal just before the target activity has proved very useful in the operational verification of microprocessors in the presence of interrupts.

During subsequent executions of the testing program by the microprocessor model or by the microprocessor under test, interrupt signal generator 24 generates the interrupt signal after 2 cycles of system clock signal CLK elapse following reception of the trigger event signal. As a result, testing program execution is interrupted during the target activity. The result produced by the microprocessor model or the microprocessor under test is then compared to an expected result as described above.

Figure 6B:
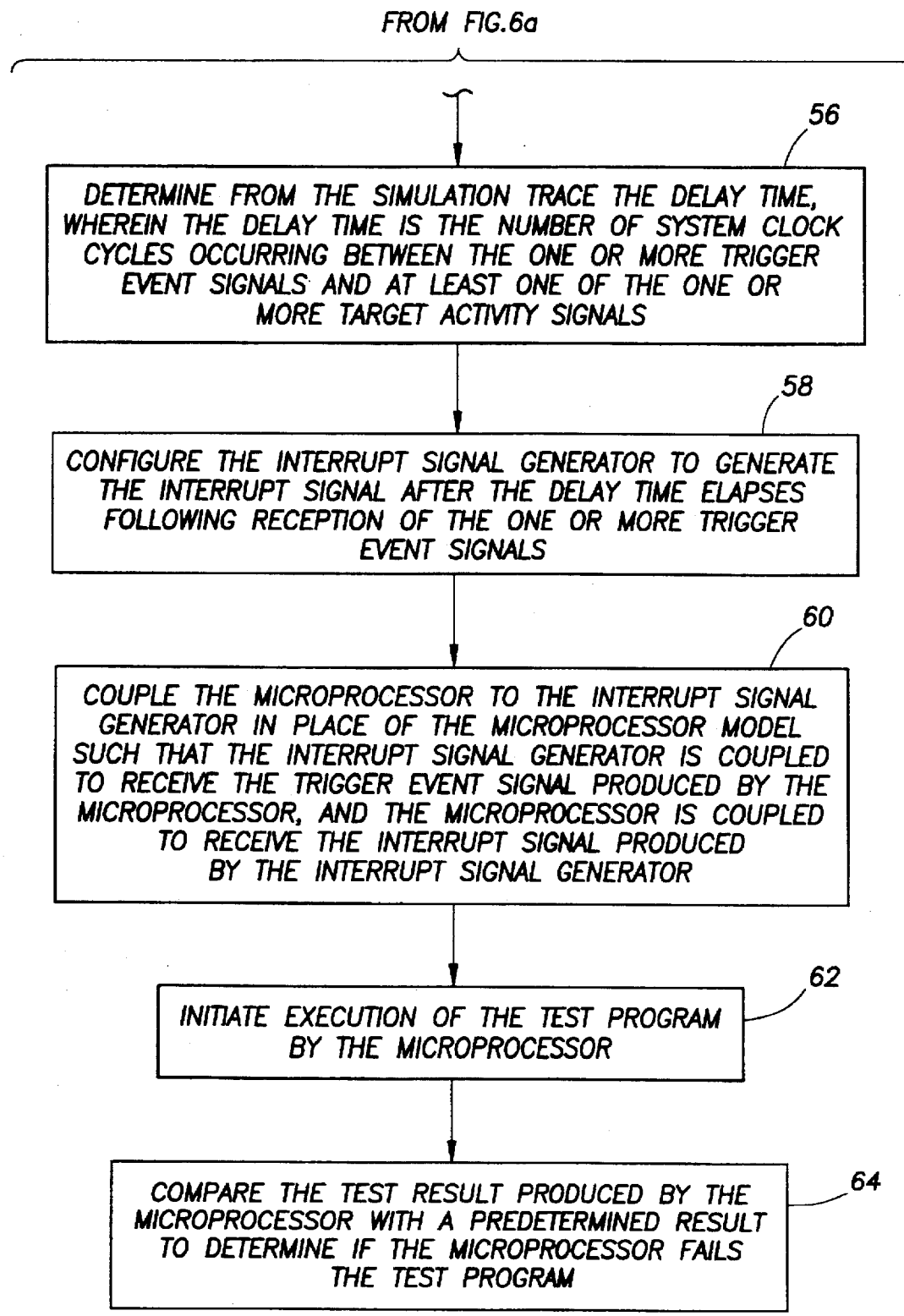

FIGS. 6a–b make up a flow diagram of a method of testing a microprocessor in order to verify proper operation of the microprocessor during a selected target activity and subject to an interrupt signal, and will be used to summarize the method of the present invention. During a first step 44, the target activity of the microprocessor is selected. A model of the microprocessor is provided in step 46 which produces one or more target activity signals during the selected target activity and is configurable to produce one or more trigger event signals. During a step 48, an interrupt signal generator is provided which is configurable to generate the interrupt signal after a delay time elapses following reception of the one or more trigger event signals. The microprocessor model is coupled to the interrupt signal generator in a step 50 such that the interrupt signal generator is coupled to receive the one or more trigger event signals, and the microprocessor model is coupled to receive the interrupt signal. During a step 52, execution of a testing program by the microprocessor model is initiated. The testing program causes the microprocessor model to produce the one or more trigger event signals, the one or more target activity signals, and a test result. During a step 54, a simulation trace is obtained during execution of the testing program by the microprocessor model. The simulation trace records the logic values of a system clock signal, the one or more trigger event signals, and the one or more target activity signals. A delay time is determined from the simulation trace during a step 56. The delay time is the number of system clock cycles occurring between the one or more trigger event signals and at least one of the one or more target activity signals. During a step 58, the interrupt signal generator is configured to generate the interrupt signal after the delay time elapses following reception of the one or more trigger event signals.

The microprocessor is coupled to the interrupt signal generator in place of the microprocessor model during a step 60 such that the interrupt signal generator is coupled to receive the trigger event signal produced by the microprocessor, and the microprocessor is coupled to receive the interrupt signal produced by the interrupt signal generator. During a step 62, execution of the testing program by the microprocessor is initiated. During execution of the testing program, the microprocessor produces the one or more trigger event signals. The interrupt signal generator receives the one or more trigger event signals and generates the interrupt signal during the selected target activity. The test result produced by the microprocessor is compared with a predetermined result during a step 64 to determine if the microprocessor fails the testing program.

It will be appreciated to those skilled in the art having the benefit of this disclosure that this invention is believed to be a method and apparatus for performing functional testing upon a microprocessor in the presence of interrupts. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for testing a microprocessor, comprising:
   providing a microprocessor model adapted to perform an activity of interest;
   using said microprocessor model to ensure an interrupt signal occurs during said activity of interest;
   substituting a microprocessor for said microprocessor model, wherein the microprocessor responds to said interrupt signal by producing a result; and
   comparing said result to an expected result to determine whether said microprocessor properly operates when undergoing both said activity of interest and said interrupt signal.

2. The method as recited in claim 1, wherein said activity of interest comprises at least one activity of a plurality of activities which occur within the microprocessor model.

3. The method as recited in claim 2, wherein performance of said activity of interest does not produce a change in logic levels of one or more signals present at corresponding external pins of said microprocessor.

4. The method as recited in claim 3, wherein said activity of interest comprises an arithmetic calculation, a program control transfer, or a page table access.

5. The method as recited in claim 1, wherein said activity of interest is an activity responsive to an instruction forwarded to said microprocessor model.

6. The method as recited in claim 1, wherein said using comprises:

producing a trigger event signal from said microprocessor model a time period prior to initiation of said activity of interest; and providing a interrupt signal generator operably coupled to receive said trigger event signal, wherein said interrupt signal generator produces said interrupt signal in response to said trigger event signal.

7. The method as recited in claim 6, wherein said interrupt signal generator produces said interrupt signal a predefined number of clock cycles after receiving said trigger event signal.

8. The method as recited in claim 7, wherein said clock cycles occur from a system clock signal coupled to said microprocessor model and said microprocessor.

9. The method as recited in claim 1, wherein said using comprises:

producing a trigger event signal from said microprocessor model a time period prior to initiation of said activity of interest;

obtaining a simulation trace during execution of a testing program by the microprocessor model;

determining from the simulation trace the length of said time period; and providing a interrupt signal generator operably coupled to receive said trigger event signal, wherein said interrupt signal generator produces said interrupt signal said time period after reception of said trigger event signal.

10. The method as recited in claim 9, wherein an activity signal is produced during said activity of interest.

11. The method as recited in claim 10, wherein said simulation trace records the logic values of a system clock signal, said trigger event signal, and said activity signal.

12. The method as recited in claim 11, wherein said time period is the number of cycles of the system clock signal occurring between the trigger event signal and the activity signal.

13. A method of performing functional testing upon a microprocessor, comprising:

selecting a target activity of the microprocessor, wherein the microprocessor is configurable to carry out the target activity;

providing a model of the microprocessor, wherein the microprocessor model produces a target activity signal during accomplishment of the target activity, and wherein the microprocessor model is configurable to produce a trigger event signal;

providing an interrupt signal generator, wherein the interrupt signal generator is configurable to generate an interrupt signal after a delay time elapses following reception of the trigger event signal;

coupling the microprocessor model to the interrupt signal generator, wherein the interrupt signal generator is coupled to receive the trigger event signal, and wherein the microprocessor model is coupled to receive the interrupt signal;

initiating execution of a testing program by the microprocessor model, wherein the testing program causes the microprocessor model to produce the trigger event signal, the target activity signal, and a test result;

obtaining a simulation trace during execution of the testing program by the microprocessor model, wherein the simulation trace records the logic values of a system clock signal, the trigger event signal, and the target activity signal;

determining from the simulation trace the delay time, wherein the delay time is the number of system clock cycles occurring between the trigger event signal and the target activity signal;

configuring the interrupt signal generator to generate the interrupt signal after the delay time elapses following reception of the trigger event signal;

coupling the microprocessor to the interrupt signal generator, wherein the microprocessor is configurable to produce the trigger event signal, and wherein the interrupt signal generator is coupled to receive the trigger event signal, and wherein the microprocessor is coupled to receive the interrupt signal;

initiating execution of the testing program by the microprocessor; and comparing the test result produced by the microprocessor with a predetermined result to determine if the microprocessor fails the testing program.

14. The method as recited in claim 13, wherein the microprocessor model comprises a file consisting essentially of a list of operational elements, interconnection between the elements, and a plurality of instructions configured to exercise the elements.

15. The method as recited in claim 13, wherein the interrupt signal generator comprises a file consisting essentially of a list of operational elements, interconnection between the elements, and a plurality of instructions configured to exercise the elements.

16. The method as recited in claim 13, wherein the interrupt signal generator comprises an addressable control register, and wherein the delay time is dependent upon a value stored within the addressable control register.

17. The method as recited in claim 16, wherein the configuring step is accomplished by modifying the testing program to cause the microprocessor to save the delay time within the addressable control register, and wherein the save operation is carried out before the trigger event signal is produced.

18. The method as recited in claim 17, wherein trigger event signal, the target activity signal, and the test result are produced in that order by the microprocessor model.

19. The method as recited in claim 18, further comprising the step of decoupling the microprocessor model from the interrupt signal generator, wherein the decoupling step precedes the step of coupling the microprocessor to the interrupt signal generator.

20. A method of performing functional testing upon a microprocessor, comprising:

selecting a target activity of the microprocessor, wherein the microprocessor is configurable to carry out the target activity;

providing a model of the microprocessor, wherein the microprocessor model produces a target activity signal during accomplishment of the target activity, and wherein the microprocessor model is configurable to produce a trigger event signal;

providing an interrupt signal generator, wherein the interrupt signal generator is configurable to generate an interrupt signal after a delay time elapses following reception of the trigger event signal, and wherein the interrupt signal generator comprises an addressable control register, and wherein the delay time is dependent upon a value stored within the addressable control register of the interrupt signal generator;

coupling the microprocessor model to the interrupt signal generator, wherein the interrupt signal generator is coupled to receive the trigger event signal, and wherein the microprocessor model is coupled to receive the interrupt signal;

initiating execution of a testing program by the microprocessor model, wherein the testing program causes the microprocessor model to generate the trigger event signal, the target activity signal, and a test result;

obtaining a simulation trace during execution of the testing program by the microprocessor model, wherein the simulation trace records the logic values of a system clock signal, the trigger event signal, and the target activity signal;

determining from the simulation trace the delay time, wherein the delay time is the number of system clock cycles occurring between the trigger event signal and the target activity signal;

modifying the testing program to cause the microprocessor to save the delay time within the addressable control register, wherein the save operation is carried out before the trigger event is produced;

decoupling the microprocessor model from the interrupt signal generator;

coupling the microprocessor to the interrupt signal generator, wherein the microprocessor is configurable to produce the trigger event signal, and wherein the interrupt signal generator is coupled to receive the trigger event signal, and wherein the microprocessor is coupled to receive the interrupt signal;

initiating execution of the testing program by the microprocessor;

comparing the test result produced by the microprocessor with a predetermined result to determine if the microprocessor fails the testing program.

21. The method as recited in claim 20, wherein the microprocessor model comprises a file consisting essentially of a list of operational elements, interconnection between the elements, and a plurality of instructions configured to exercise the elements.

22. The method as recited in claim 20, wherein the interrupt signal generator comprises a file consisting essentially of a list of operational elements, interconnection between the elements, and a plurality of instructions configured to exercise the elements.

23. A microprocessor testing system for the functional testing of a microprocessor, wherein the microprocessor model is configurable to produce a trigger event signal, the microprocessor testing system comprising:

a CPU configured to execute instructions;

a system bus adapted for coupling to one or more peripheral devices;

a memory bus;

chip set logic coupled to the CPU, the system bus, and the memory bus; and a memory unit coupled to the memory bus and configured to store data, wherein the memory unit comprises:

a microprocessor model, wherein the microprocessor model is configurable to produce the trigger event signal;

a memory model, wherein the memory model comprises a memory control unit, and wherein the memory control unit comprises an interrupt signal generator, and wherein the interrupt signal generator is coupled to receive the trigger event signal and configurable to generate an interrupt signal after a delay time elapses following reception of the trigger event signal; and a bus model, wherein the bus model engine comprises a plurality of instructions, and wherein the bus model is adapted for alternately coupling to the microprocessor model and to the microprocessor, and wherein the bus model is configured to transfer data between the microprocessor model and the memory model when coupled to the microprocessor model, and wherein the bus model is configured to transfer data between the microprocessor and the memory model when coupled to the microprocessor.

24. The microprocessor testing system as recited in claim 23, wherein the microprocessor model is coupled to receive the interrupt signal when the bus model is coupled to the microprocessor model, and wherein the microprocessor is coupled to receive the interrupt signal when the bus model is coupled to the microprocessor.

25. The microprocessor testing system as recited in claim 24, wherein the microprocessor model comprises a file consisting essentially of a list of operational elements, interconnection between the elements, and a plurality of instructions configured to exercise the elements.

26. The microprocessor testing system as recited in claim 23, wherein the memory model comprises a file consisting essentially of a list of operational elements, interconnection between the elements, and a plurality of instructions configured to exercise the elements.

27. The microprocessor testing system as recited in claim 26, wherein the interrupt signal generator comprises a portion of the memory model.

28. The microprocessor testing system as recited in claim 23, wherein the interrupt signal generator comprises an addressable control register.

29. The microprocessor testing system as recited in claim 23, wherein during the first part of the functional test procedure the interrupt signal generator is coupled to receive the trigger event signal produced by the microprocessor model, and the microprocessor model is coupled to receive the interrupt signal.

30. The microprocessor testing system as recited in claim 23, wherein the memory unit further comprises a test engine, wherein the test engine comprises a plurality of instructions, and wherein the test engine is coupled to the bus model, the memory model, the microprocessor model when the when the bus model is coupled to the microprocessor model, and the microprocessor when the bus model is coupled to the microprocessor, and wherein the test engine is configured to check the functions of the bus model, the memory model, the microprocessor model when the test engine is coupled to the microprocessor model, and the microprocessor when the test engine is coupled to the microprocessor.

* * * * *